United States Patent
Raben

(10) Patent No.: US 7,205,175 B2
(45) Date of Patent: Apr. 17, 2007

(54) METHOD FOR ENCAPSULATING A CHIP AND/OR OTHER ARTICLE

(75) Inventor: Jurgen Leonardus Theodorus Maria Raben, Terborg (NL)

(73) Assignee: Elmos Advanced Packaging B.V., Nijmegen (NL)

( * ) Notice: Subject to any disclaimer, the term of this patent is extended or adjusted under 35 U.S.C. 154(b) by 253 days.

(21) Appl. No.: 10/490,945

(22) PCT Filed: Sep. 26, 2002

(86) PCT No.: PCT/NL02/00621

§ 371 (c)(1),
(2), (4) Date: Oct. 6, 2004

(87) PCT Pub. No.: WO03/028086

PCT Pub. Date: Apr. 3, 2003

(65) Prior Publication Data

US 2005/0054144 A1 Mar. 10, 2005

(30) Foreign Application Priority Data

Sep. 26, 2001 (EP) .................... 1019042

(51) Int. Cl.
*H01L 21/00* (2006.01)
*H01L 21/50* (2006.01)
*H01L 21/48* (2006.01)
*H01L 21/44* (2006.01)

(52) U.S. Cl. .................. 438/65; 438/55; 438/64; 438/127; 438/48

(58) Field of Classification Search ............ 438/48, 438/51, 54–55, 64–65, 69, 127
See application file for complete search history.

(56) References Cited

U.S. PATENT DOCUMENTS 4,894,707 A  1/1990 Yamawaki et al.

(Continued)

FOREIGN PATENT DOCUMENTS

EP  1 220 309  7/2002

(Continued)

OTHER PUBLICATIONS

Patent Abstracts of Japan, vol. 1998, No. 08, Jun. 30, 1998—& JP 10 075040 A (Toshiba Chem Corp), Mar. 17, 1998 the whole document.

(Continued)

*Primary Examiner*—Luan Thai
(74) *Attorney, Agent, or Firm*—Young & Thompson

(57) ABSTRACT

Method for encapsulating a chip with encapsulant, one portion of the surface of which chip must remain free of encapsulant, comprising the following steps: fixing the chip on a carrier with a suitable conductor structure, placing carrier and chip in one part of a mould, positioning a material on the mould or the chip surface, such that this material is clamped between the chip and mould after the mould has been closed, closing the mould, introducing the encapsulant and at least partially curing the encapsulant. The material is a heat-resistant moulding, having dimensions in the directions parallel to the surface of the chip such that an accurately delimited portion of the chip surface will be covered when the mould is closed, and a dimension in the direction perpendicular to the chip surface determined by the distance between the mould surface and the free portion of the chip surface.

32 Claims, 3 Drawing Sheets

U.S. PATENT DOCUMENTS

| | | | |
|---|---|---|---|
| 5,622,873 A | | 4/1997 | Kim et al. |
| 5,862,248 A | * | 1/1999 | Salatino et al. ............. 382/124 |
| 5,897,338 A | * | 4/1999 | Kaldenberg ................. 438/116 |
| 6,187,243 B1 | * | 2/2001 | Miyajima .............. 264/272.15 |
| 6,300,169 B1 | * | 10/2001 | Weiblen et al. ............. 438/127 |
| 6,667,439 B2 | * | 12/2003 | Salatino et al. ............. 174/565 |
| 6,811,738 B2 | * | 11/2004 | Magni et al. ................ 264/510 |
| 6,860,731 B2 | | 3/2005 | Ho et al. |

FOREIGN PATENT DOCUMENTS

| | | |
|---|---|---|
| NL | 1 003 315 | 12/1997 |
| WO | WO 01 84618 | 11/2001 |

OTHER PUBLICATIONS

Patent Abstracts of Japan, vol. 012, No. 321 (M-736) Aug. 31, 1988—& JP 63 089313 A (TOK Corp), Apr. 20, 1988 the whole document.

Patent Abstracts of Japan vol. 008, No. 206 (E-267), Sep. 20, 1984—& JP 59 092534 A (Matsushita Denki Sangyo KK), May 28, 1984 the whole document.

Patent Abstracts of Japan vol. 1998, No. 03, Feb. 27, 1998—& JP 09 304211 A (Omron Corp), Nov. 28, 1997 the whole document.

Patent Abstracts of Japan vol. 1998, No. 06, Apr. 30, 1998—& JP 10 034699 A (APIC Yamada KK), Feb. 10, 1998 abstract.

Patent Abstracts of Japan, vol. 017, No. 214 (E-1357), Apr. 27, 1993—& JP 04 352435 A (Mitsubishi Electric Corp), Dec. 7, 1992 the whole document.

* cited by examiner

METHOD FOR ENCAPSULATING A CHIP AND/OR OTHER ARTICLE

The invention relates to a method for encapsulating a chip with encapsulant, one portion of the surface of which chip must remain free of encapsulant, comprising the following steps
(a) fixing the chip on a lead frame, substrate, film or other carrier that can be provided with a suitable conductor structure,
(b) if necessary, producing conducting links between contact locations on the chip and contact locations of the conductor structure,
(c) placing carrier and chip in one part of a two-part or multi-part mould,
(d) positioning a material on one part of the mould or one part of the chip surface, such that this material is clamped between the said parts of chip and mould after the mould has been closed,
(e) closing the mould, introducing the encapsulant and creating conditions under which the encapsulant at least partially cures in the mould.

PRIOR ART

A method of the type described above has already been disclosed in NL 1003315. In this known method a bubble of heat-resistant, deformable material, preferably made up of a (silicone) gel, is applied either to the surface of the chip or to a part of the mould intended for this purpose, in such a way that this material is clamped between the portion of the chip surface that is to be kept free and the opposite part of the mould when the mould is closed. Although this process functions well per se, it has a number of disadvantages.

A first disadvantage is the inaccuracy with which the portion of the chip surface that is to be kept free can be delimited. In general a dispenser will be used for applying the bubble of heat-resistant, deformable material. The positioning of the dispensing nozzle of the dispenser has a certain degree of inaccuracy and the volume of material to be dispensed is also subject to some inaccuracy. Furthermore, when the mould is closed the bubble will be compressed, as a result of which the extent of the outline on the chip that is determined by the bubble increases. All these effects give rise to a certain degree of inaccuracy in delimiting the surface that has to remain free.

A second disadvantage lies in the fact that the shape of the portion of the chip surface to be masked cannot be truly arbitrarily chosen. When a dispenser is used that dispenses a bubble of material the outline of the area to be kept free is in most cases actually restricted to circular shapes. In other words, only an area with a circular boundary can be kept free, a certain degree of inaccuracy having to be taken into account when determining the circle diameter. For relatively small surfaces there are no other options. For larger surfaces it is possible to use an X-Y dispenser, the dispensing nozzle of which is able to move independently in all directions in a plane parallel to the chip surface. Rectangular or polygonal shapes of the material can be achieved with a dispenser of this type. In this case also the outline will have a certain degree of inaccuracy depending on the substrate, the amount of material and the degree of wetting (flow characteristics) of the material to be dispensed. Furthermore, all corners of shapes provided with one or more corners are always rounded. A corner with a distinct corner point cannot be produced with an X-Y dispenser.

A further disadvantage is the fact that in general a dispenser is not able to operate inside a mould (or a part of a mould) and therefore separate steps are needed to achieve the desired result. First of all the dispenser is used in a separate location, optionally with a separate facility for the (at least partial) curing (for example UV or heat curing) of the material, and the chip is then transported to the mould and positioned these It is pouted out that chip designers must take account of the abovementioned limitations of existing methods. This means that chip deters have limited options as for as the layout of the chip surface is concerned.

Another known method is described in U.S. Pat. No. 5,622,873. In tis method a layer of photoresist is used as the material, by means of which the portion of the chip surface to be kept free can be accurately masked. However, this photoresist layer is already applied during the final processing steps for the wafer and is thus already present when the wafer is divided into the individual chips. After carrying out the abovementioned steps (a), (b) and (c), the chip is placed in a mould, which mould has to be provided with a columnar insert, the cross-sectional shape of which accurately corresponds to the shape of the photoresist layer so that the column fits accurately onto the photoresist layer. In the example shown the column insert has a rectangular shape.

If use is made of a mould having an insert, the use of a part with circular cross-section will then be preferred for constructional reasons. An insert of rectangular shape or optionally more complex shape will in general lead to (much) higher production and installation costs, therefore constitutes a serious disadvantage and must therefore be avoided.

Finally, after encapsulating the chip further process steps have to be carried out to remove the photoresist layer, which is considered to be a disadvantage In general, the aim in the industry is to make optimum use of the available chip surface. This means, inter alia, that in the case of a chip having an array of light-sensitive elements (for example for use in still and movie cameras) the connection location for the wire bonds are preferably positioned as close as possible to the array. This means that the shape of the layer that has to be applied to the array so as to keep the array free during encapsulation process must be accurately determined and that the layer formed must be accurately positioned. Depending on the application, such arrays can have various shapes, such as rectangular (video applications), circular or oval (direct interaction with a round or oval lens), straight (detectors) or other arbitrary shapes.

DEFINITION OF THE PROBLEM AND AIM OF THE INVENTION

There is thus a need for a method with which an arbitrarily shaped portion of the surface of a chip can be kept free during the encapsulation process without it being necessary for this purpose to use dispensers to apply a material and without it being necessary to adapt the wafer production process to produce a shaped photoresist layer on each of the chips in the wafer, which photoresist layer has to be removed by additional processing steps after completion of the encapsulation process.

The aim of the invention is, now, to provide a method with which this need is met.

THE INVENTION

According to the invention the abovementioned objective is met in that the material in step (d) consists of a pre-produced moulding made of a suitable heat-resistant material, the dimensions of which in the directions parallel to the surface of the chip are so chosen that a portion of the chip surface, accurately delimited as desired and including the said portion of the chip surface that is to be kept free, will be covered when the mould is closed, and the dimension of which in the direction perpendicular to the chip she is determined by the desired distance between the mould surface and the said portion of the chip surface that is to be kept free.

By making me of a separate moulding a high degree of accuracy can be achieved. On the one hands a wide variety of accurate production techniques are available for accurately achieving the outline of the moulding, which ultimately determines dig portion of the surface of the chip that is to be kept free. Secondly, the is no need for a separate additional processing station, as is the case when a dispenser is used. The moulding can be produced in a suitable manner as a separate product and be placed directly in the mould. Positioning in the mould can take place with high accuracy.

Within the scope of the invention it is preferable that the moulding is produced from a relatively soft heat-resistant material. Because the moulding comes into direct contact with the surface of the chip, hard materials are preferably avoided on the grounds of possible damage to the surface of the chip. That is not to say that bard or harder materials are precluded per se. However, these can only be used if that part of the moulding that comes into contact with the surface of the chip comes into contact with a smooth and pressure resistant part of that surface.

According to a preferred embodiment of the method, the production of the connections in step (b) is effected by wire bonding, the wire bonds taking up a certain amount of space above the chip surface, the dimension of the moulding in the direction perpendicular to the chip surface being determined by the maximum height of the said space. By choosing the thickness of the moulding to be greater than the, height of the wire bonds above the chip surface it is possible to prevent contact with the wall of the mould or the wall of the mould insert, whilst the thickness of the encapsulation at the location of the wire bonds can still be chosen as desired.

The invention relates not only to a method but also to a moulding for use in such a method. According to the invention such a moulding is characterised in that the dimensions of the moulding that, after placing in the mould, correspond to the directions parallel to the surface of the chip are so chosen that a potion of the chip surface, accurately delimited as desired and including the said portion of the chip surface that is to be kept free, will be covered when the mould is closed, and in that the dimension of the moulding that, after placing in the mould, corresponds to the direction perpendicular to the chip surface is determined by the desired distance between the mould surface and the said portion of the chip surface that is to be kept free.

A very simple embodiment of the moulding is characterised in that the moulding is provided with a top face and a bottom face, essentially parallel to one another, and side walls running between these. This also offers a range of possibilities.

According to one of these possibilities the side walls are at least approximately perpendicular to the top wall and bottom wall. The moulding is therefore a column.

According to another possibility the dimensions of the top face are greater than those of the bottom face and the side walls are at a certain age with respect to top face and bottom face. Within this context the moulding can, in particular, be characterised in that the moulding as a whole has the shape of an inverted truncated pyramid or in that the moulding as a whole has the shape of an inverted truncated cone.

In many cases the shape of the bottom face will determine the outline of the portion of the surface of chip or article that is to be kept free. However, this is not essential. It is also possible for the bottom face to be provided with a relief that projects outwards over a short distance and determines the outline of the portion of the surface of chip or article to be masked.

Instead of the columnar embodiments other shapes cam also be used which are specifically intended to be introduced into and fixed in a recess in the mould wall. These embodiments in general are characterised in that the moulding is made up of two sections, a first section provided with a top face, an imaginary bottom face and side walls running between these, the dimensions of the top fine being greater than those of the imaginary bottom face and the side walls at least partially being inclined at a certain angle between the top wall and the imaginary bottom wall, and a second section provided with an imaginary top wall, a bottom wall and side walls running between these, the imaginary top wall and the bottom wall having the same dimensions, and the imaginary bottom wall of the first section adjoining the imaginary top wall of the second section. This embodiment can be regarded as a column on a foot, the foot being used to fix the column in the mould.

With this embodiment it will in general, but not necessarily, be the case that the dimensions of the said imaginary walls are identical to one another.

If the portion of the surface that is to be kept free is a surface that is particularly susceptible to damage, it will be preferable that the bottom face is provided with a recess that is shaped in such a way that, when carrying out the method, the moulding does not come into contact with a predetermined portion of the chip surface located within thee said portion of the surface of chip or article that is to be masked.

For fixing purposes the moulding can be provided with a protruding part on the top face. This protruding part can be provided with a button but can also be provided with a hole with internal thread.

As already pointed out, within the context of the invention it is furthermore preferable that use is made of a moulding technique for production of the moulding. The use of a mould leads to accurate shaping, subsequent machining usually not being required. In addition, it is possible to create particular embodiments of the moulding fairly easily with the aid of a mould, for example a moulding that is provided with a recess in the bottom face (the face oriented towards the chip the operating position). The edge of the bottom face around the recess provides the seal against the surface of the chip and thus determines the outline of the portion of the surface that is to be kept fee, for example the light-sensitive or pressure-sensitive portion of the chip surface. The advantage is that the sensitive portions of the chip surface also do not come into contact with the moulding (only the immediate surroundings thereof), as a result of which the risk of damage can be made very small.

The moulding can be fixed to the inner surface of the mould with the aid of a suitable adhesive. In this case the relevant inner surface of the mould is preferably provided with a shallow recess. A quantity of adhesive can be introduced into this recess (which quantity can be matched to the volume of the recess), after which the moulding is pressed against the adhesive without deforming it. In this way no additional layer of adhesive is introduced between the mould surface and the moulding and therefore no deviation in the sizing is introduced. A disadvantage can be that the adhesive is no longer accessible, so that possible replacement of the moulding can present problems.

At the location where the moulding has to be positioned in contact with the inner surface of the mould, it is also possible to make an opening in the mould to which a vacuum source can be connected via a suitable line. In this case the moulding is held in place by the vacuum. With a construction of this the replacement or removal of the moulding is, or course, very easy.

In order to facilitate positioning during mounting of the moulding, it is preferable that the mould is provided with a recess and the moulding is provided with a protruding part that fits in said recess.

Instead of fit a pre-produced moulding to the wall of the mould or to a mould insert using adhesive or using mechanical means, use can be made of a vulcanisation process by means of which the moulding is moulded and fixed directly to the wall of the mould (or the insert).

After fixing the moulding a correction step can be carried out making use of, for example, laser equipment that operates highly accurately, by means of which the final corrections can be made the shape of the moulding if necessary.

Taking account of a moulding that preferably has been produced from a somewhat deformable material, it may be preferable for the dimensions of the said recess to increase gradually or stepwise from the surface of the mould and for the protruding put of the moulding to be adapted correspondingly to this shape. By virtue of the deformability it is possible to pinch the thicker section of the moulding together to some extent and to insert it in the recess. A fixing with a tight fit is achieved in this way.

It is also possible for the moulding to be provided with a protruding part that fits in an opening extending through the mould wall and to interact with further fixing means on the back of the wall.

FIGURES

The invention will be explained in more detail below with reference to the appended figures.

FIG. 1 shows the use of a columnar moulding that has been fixed to the inside wall of a top part of the mould in a suitable manner, for example using an adhesive.

FIGS. 2a, 2b and 2c show a number of possible shapes of the bottom face of the moulding.

FIG. 3a shows, in perspective, a shaped section protruding from a columnar moulding.

FIG. 3b shows a possible way in which the moulding from FIG. 3a can be fixed to a mould wall.

FIG. 4a shows a moulding with parallel top and bottom faces and sloping side faces, which moulding is also provided with a recess in the bottom face oriented towards the chip.

FIG. 4b shows a section through a part of a mould in which the moulding from FIG. 4a has been mounted, making use of a recess in the inside wall of the mould, and is in contact with that part of the surface of a chip that has to remain free during the encapsulation process.

FIG. 5a shows, diagrammatically, a first method for positioning and fixing a moulding on the mould wall, where the moulding is provided with a button.

FIG. 5b shows, diagrammatically, a second method for positioning and fixing the moulding on the mould wall, where use is made of a screw.

FIG. 5c shows, diagrammatically, a third method for positioning and fixing the moulding on the mould wall, where the moulding fits in a recess in the inside wall of the mould.

FIG. 5d shows, diagrammatically, a fourth method for positioning and fixing the moulding on the mould wall, where the recess in the inside wall of the mould is provided with an undercut and the shape of the moulding is matched to this.

FIG. 5e shows, diagrammatically, a sixth method for positioning and fixing the moulding on the mould wall intended for use of a vacuum at the rear of the moulding.

FIG. 5f shows, diagrammatically, a sixth method for positioning and fixing the moulding on the mould wall, whom the moulding is provided with a shank that fits in a matched recess in the mould wall.

FIG. 5g shows, diagrammatically, a seventh method for position and fixing the moulding on the mould wall similar to that in FIG. 5f but with a modified shape.

FIG. 5h shows, diagrammatically, an eight method for positioning and fixing the moulding on the mould wall, where use is made of a glue or adhesive.

FIG. 6a shows the use of a mould with insert on which the moulding is fixed.

FIG. 6b shows the mould from FIG. 6a in the closed position containing therein the chip to be encapsulated and the lead frame to be partially ensued, as well as the wire bonds between frame and chip.

FIG. 6c shows the use of a cover film in the mould in order to reduce wear, in particular of the moulding.

Figure 1:
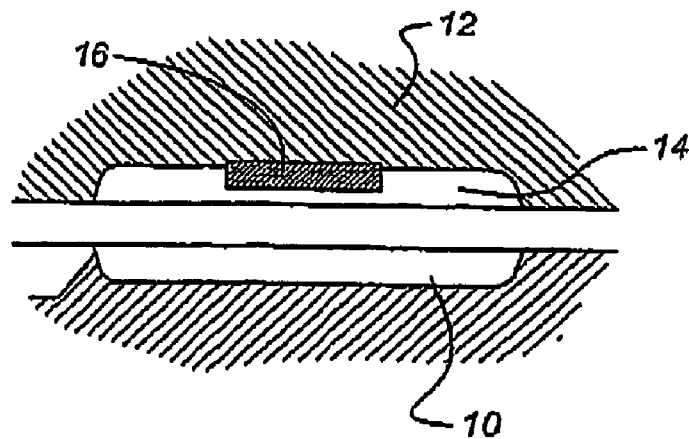
FIG. 1 shows, diagrammatically, a partial section through a mould for the encapsulation of chips, consisting of at least a bottom mould part 10 and a top mould part 12. Between the two mould parts there is the open space 14, the dimensions of which determine the dimensions of the casing that is formed around a chip with this mould. A moulding 16 is fixed to the inner surface of the top part 12. This moulding extends from the wall of the mould part 12 into the cavity 14 to such an extent that during operation the bottom face of the moulding 16 presses against at least part of the chip to be encapsulated The shape of the bottom face of the moulding has been so chosen that this corresponds to the portion of the chip surface that is to be masked.

Instead of direct positioning on the inside wall of the mould, it is also possible to provide the mould with an insert that protrudes in the interior apace of the mould, the moulding being positioned on the bottom face of said instant. This is shown diagrammatically in FIG. 6.

FIG. 6a again shows a section through part of a mould consisting of at least a bottom mould part 10 and a top mould part 12. Between the two mould parts there is the open space 14, the dimensions of which determine the dimensions of the casing that is formed around a chip with this mould. The mould is provided with an insert 18 protruding into the mould. A moulding 16 is positioned and fixed on the bottom face of the insert 18.

Figure 6A:
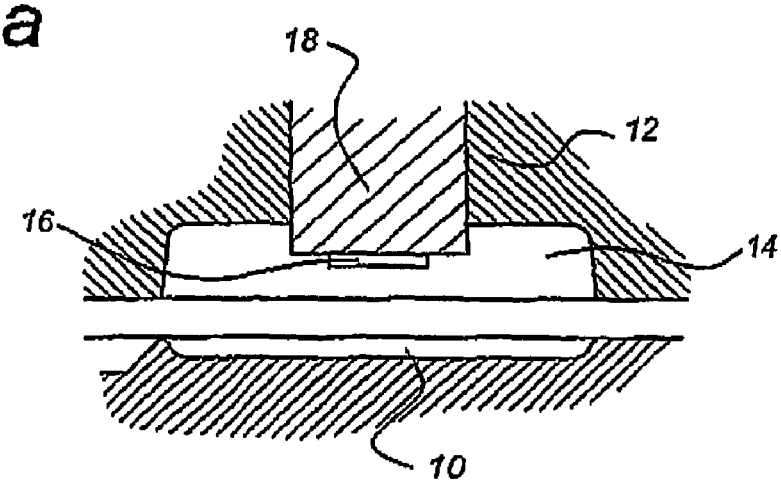
Figure 6B:
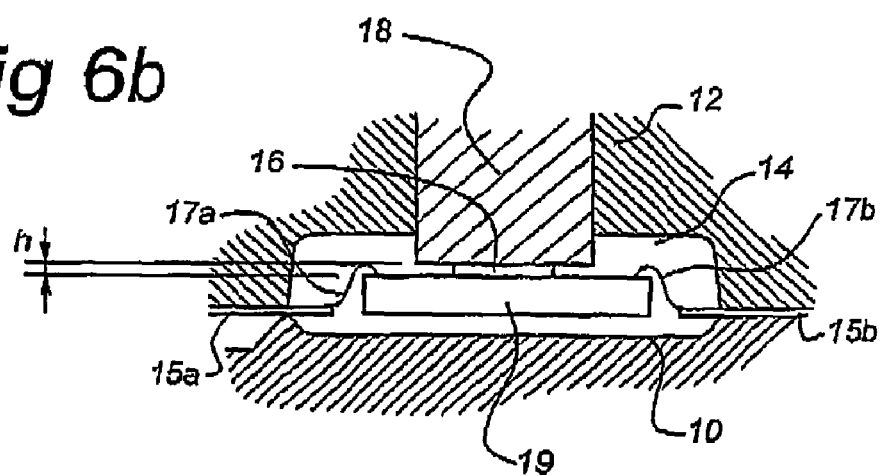

If a lead frame with a chip firmly bonded thereon is placed in this mould and the mould is closed, the situation shown diagrammatically in FIG. 6b is then obtained, This figures shows the chip 19, the parts 15a and 15b often lead fame and the wire bonds 17a and 17b between chip and lead frame. It can be seen from this figure that the wire bonds extend above the site of the chip 19. The height h of the moulding 16 is now preferably suitably chosen such that the wire boas are not able to come into contact with the bottom of the insert 18. It is preferable to choose the thickness of the moulding somewhat larger, such that an encapsulation of adequate desired thickness above the wire bonds is obtained.

Figure 6C:
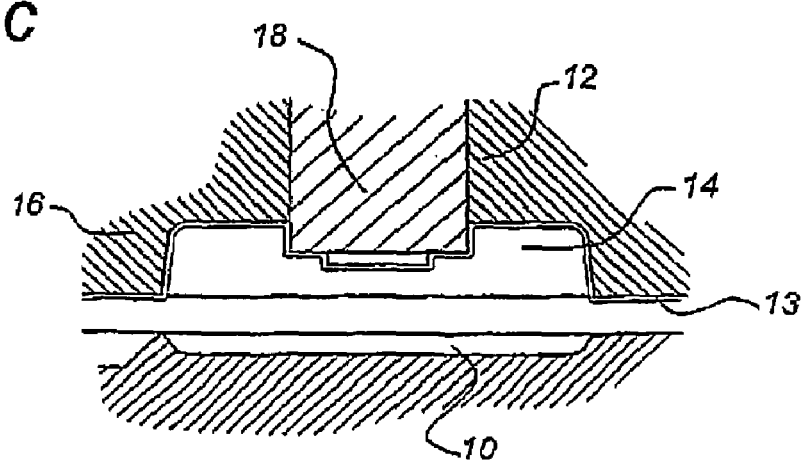

Finally, it is preferable, after positioning the moulding but before closing the mould, to apply a highly stretchable and very thin film to the inside wall of the mould in the manner shown diagrammatically in FIG. 6c. By virtue of the high stretch that this film is able to withstand, the film is pressed against the wall, against the insert and against the moulding during the encapsulation process by the encapsulant introduced into the mould. The film will follow the outlines of these parts very closely. It will be clear that account must be taken of the thickness of the film when determining the dimensions of the moulding. The film provides for easy release of the encapsulated chip and, in particular, provides for reduced wear on the moulding 16.

In FIGS. 1, 6a and 6b the moulding 16 can be fixed to the bottom wall of the top mould part 12 or the insert 18 using a glue or adhesive. In this case the wall of the mould can be provided with a shallow recess, the dimensions of which correspond to those of the moulding 16, as a result of which positioning of the moulding 16 is facilitated. However, this is not essential.

Figure 2A:
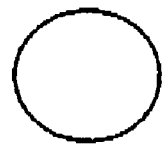
Figure 2B:
Figure 2C:
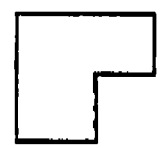

By way of example, FIGS. 2a, 2b and 2c show a number of possible shapes of the bottom face of the moulding or, respectively, of the portion of the chip to be masked FIG. 2a shows a circular face, FIG. 2b a rectangular, in particular square, face, and FIG. 2c shows a rectangular ice with a cut-out at one of the corners. In principle any shape is possible, although the simpler shapes can often be produced using simpler, and thus less expensive, production techniques and will thus be preferred on the grounds of cost. Moreover, the moulding in FIG. 1 is of columnar construction, the top and the bottom faces having the same shape. If the height of the column is relatively small, mouldings of this type cam optionally be produced, for example, using a punching technique. More complex contour shapes can be better produced using a moulding technique. Although various production methods are available, the moulding technique is generally preferred.

Figure 3A:
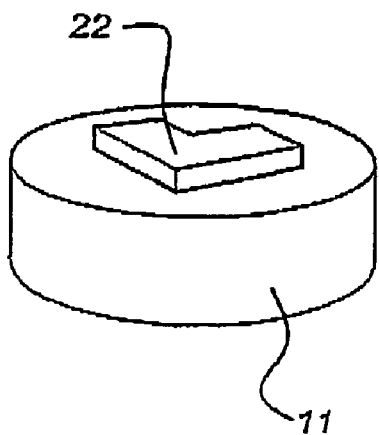
Figure 3B:
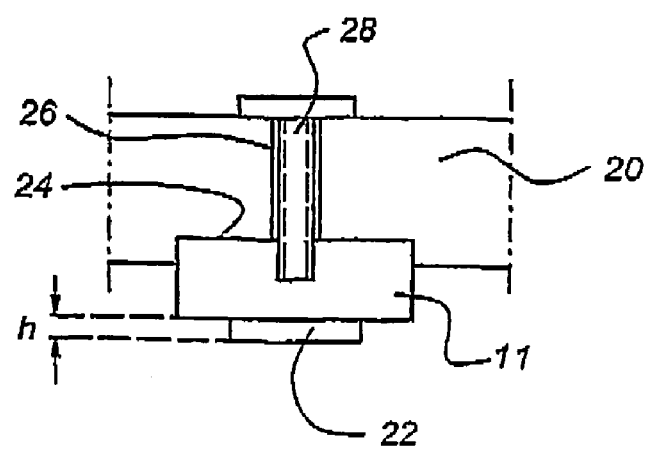

FIG. 3a shows a column 11 with an arbitrarily chosen circular cross-section. The bottom face is so made that a protruding contour section 22 is obtained, the peripheral shape of which determines the outline of the portion of the chip surface to be masked. In this example the shape of the protruding part corresponds to the shape shown in FIG. 2c. A cross-section through the column 11 is shown in FIG. 3b, which column is mounted in a mould part. The dimension h, indicated in the cross-section in FIG. 3b, can be very small. This dimension must be sufficient to allow encapsulant to reach as far as the contour. An example of the way in which this moulding can be fixed in the mould is shown in FIG. 3b. The top part 20 of the mould is provided with a recess 24. A hole 26 emerges in this recess 24 and makes it possible for the column to be positioned and fixed in the recess via a screw 28 in the manner shown. Within the context of this embodiment a set of mouldings can be created, all provided with a column of uniform cross-section, so that this always fits in the recess 24 in the mould, and furthermore provided with a contour part 22, the shape of which can vary depending on the chip to be encapsulated. Embodiments which differ from the standard only in respect of the diameter of the column can be used for smaller or larger outlines. Because the top section of the column is always adapted to the diameter and shape of the recess 24, all these mouldings fit.

Within the context of the invention circular columns, but also columnar mouldings of a different shape, can be used.

Figure 4A:
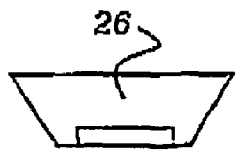
Figure 4B:
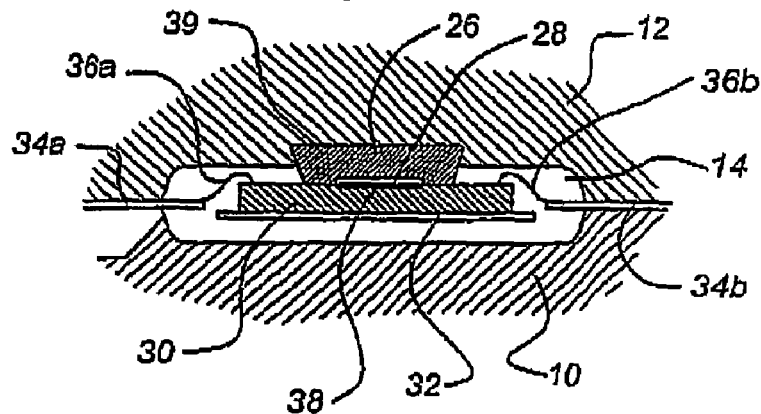

FIGS. 4a and 4b show the use of a moulding 26. This moulding has a top face ad a bottom face which, as can be seen in the figure, have different dimensions. There are sloping side walls between top face and bottom face. In this case it is no longer possible to refer to a column but to an inverted truncated pyramid, assuming that the moulding has an at least approximately square top face and also a square bottom face. However, the cross-section in FIG. 4a is equally applicable to an inverted truncated cone with a circular top face and a circular bottom face. Both embodiments ill within the scope of the invention, as do more complex shapes that nevertheless can display a similar cross-section The moulding in FIG. 4 cam be used with a completely flat bottom or with a recess in the bottom, as is shown by a dotted line in FIG. 4a.

FIG. 4b shows the use of the moulding from FIG. 4a in a mould of the type shown in FIG. 1, but then provided with recess in the inside wall of the top part 12. The mould parts are indicated by 10, 12 and 14 and the moulding has the reference numeral 26. The chip 30, which is fixed to a base plate 32, cam also be seen in FIG. 4b. Leads 34a and 34b, which form part of a lead frame, extend through the mould to the outside. Contacts of the chip 30 are connected via we bonds 36a and 36b in an electrically conducing manner to the leads 34a and 34b. The size and shape of the protruding part of th moulding may have to be determined to take into account of the height of the win bonds. The sensitive part of the chip is indicated by 38. The (optional) recess 28 in the bottom face of the moulding is sized such that least the sensitive part 38 of the surface does not come into contact with the moulding 26. This gives rise to a number of advantages:

Any capillary action between the suffice of the chip and the bottom face of the moulding is reduced in any event.

Even chips with highly sensitive surfaces can thus be safely encapsulated. Consideration can be given to chips which are provided with a microlens (for optical purposes) in the sensitive part of the surface or chip which are provided with a membrane (for measuring pressures.)

The moulding 26 is so sized that the dimensions increase towards the top. Assuming a rectangular, in particular square, bottom face and top face, the moulding can thus on the whole be described as an inverted truncated pyramid. The recess 39 in the top part 12 of the mould has a corresponding shape. It will be clear that the moulding must be deformable to some extent in order to be able to position the moulding 26 in the recess 39. Once the moulding is in place the tightly fitting mounting then results in a stable and accurately positioned whole.

There are many other possibilities for positioning and fixing the moulding in the correct position in or on the relevant part of the mould. A number of these possibilities will be discussed in more detail with reference to FIG. 5.

Figure 5A:
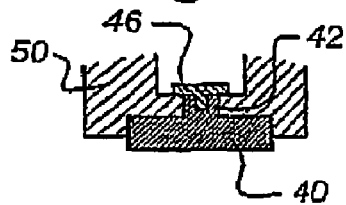

FIG. 5a shows a moulding 40 with a shank 42, with button 44, at the top. The shank 42 fits in a drilled hole through the wall of the mould part 50 and the button 44 ensures that the construction is secured. The part protruding into the mould is of columnar construction in this case. Here again use is made of the fact that the moulding (at least the button 44 aid the shank 42) has been produced from a material that is deformable to some extent. It would be conceivable to produce the part of the moulding that protrudes into the mould from a material other than that used for the shank and the button, but his makes the production of the moulding more complex and the price increases.

Figure 5B:
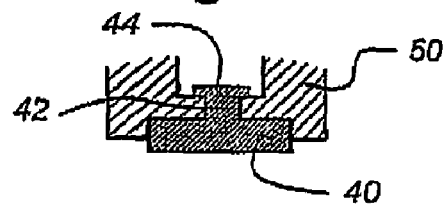

FIG. 5b shows an embodiment of the moulding that is similar to the embodiment in FIG. 5a. In this case, however, the button 44 has been replaced by a screw 46 that is screwed into a threaded hole in the sank 42 of the moulding 40. In this case the designer has much greater freedom in the choice of material because the material of the moulding in principle does not have to be deformable, at least for mounting.

Figure 5C:
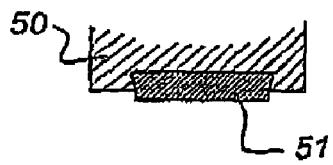
Figure 5D:

FIG. 5c shows an embodiment in which there is a recess with an undercut in the wall of the mould. A recess with an undercut means a recess that rally, or stepwise, becomes broader as the distance from the inside increases. FIG. 5c shows a gradual increase in file dimensions, whilst FIG. 5d shows a stepwise increase in the dimensions. It will be clear that in both cases a certain degree of deformability of the moulding 51 or 49, respectively, is needed in order to be able to place this moulding in position.

Figure 5E:
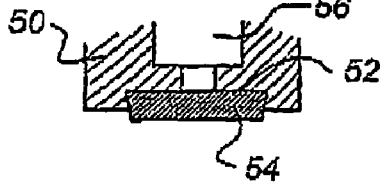

FIG. 5e shows an embodiment where the mould part is provided with a recess 52 in which the top of the moulding 54 fits. A hole 56 though the mould part opens into the recess 52. During operation a vacuum source (not shown) is connected to the other end of this hole 56. As a consequence of the resulting vacuum, the moulding is held properly in place, eve during release from the mould. Furthermore, mounting of the moulding is facilitated because air inclusions between the moulding and the recess are effectively prevented. The removal of the moulding is also easier. For this purpose compressed air can be fed, or a suitable implement can be used, via the hole 56 in order to free the moulding from its plate.

Figure 5F:
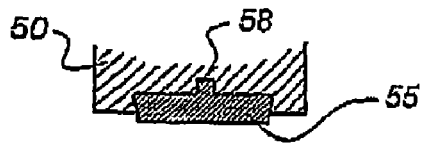

FIG. 5f shows a moulding similar to that shown in FIG. 5c but now provided on the top with a shank 58 that has to be positioned in a corresponding hole in the mould part. This shark 58 fits in a suitable relatively small hole or recess 60 in the wall of the recess 60. On the one hand, any air inclusions are trapped in the hole 60. On the other hand, the presence of the shank 58 ensures that the mid section of the moulding is unambiguously positioned. Certainly in the case of larger mouldings made of relatively deformable material the mid section of the moulding can display some mobility, which is eliminated in this case.

Figure 5G:

In FIG. 5g the shank 58 has been replaced by a protrusion, the dimensions of which increase with the distance away from the inside wail of the mould part.

Figure 5H:

Finally, FIG. 5h shows the use of adhesive for fixing toe moulding in a recess in the inside wall of the mould. In order to prevent the thickness of the adhesive layer having an effect on the sizing of the moulding, the adhesive is applied in a further small recess 62, it being possible to match the quantity of adhesive to the volume of this further recess 62.

A large proportion of the shapes discussed above can as a whole be described as a moulding, characterised in that the moulding is made up of two sections, a first section provided with a top face, an imaginary bottom face and side walls running between these, the dimensions of the top face being greater than those of the imaginary bottom face and the side walls being at least partially being inclined at a certain angle between the top wall and the imaginary bottom wall, and a second section provided with an imaginary top wall, a bottom wall and side walls ruing between these, the imaginary top wall and the bottom wall having essentially the same dimensions, and the imaginary bottom wall of the first section adjoining the imaginary top wall of the second section. In this context it is preferable that there is a small difference in dimensions between top face and bottom face of the second section (bottom wall somewhat smaller than top wall) in order to facilitate the release of the encapsulated product at the end of the method.

Finally it is pointed out that the encapsulation process takes place at a relatively high temperature. This offers the possibility of evening out any tolerances between moulding and mould by means of a suitable choice of material. For this purpose in particular the material of the moulding must have a greater coefficient of expansion than the material of the mould. The consequence of this is that in the case of those embodiments where the mould is provided with a recess in which at least part of the moulding fits any inaccuracies in the sizing are evened out because the moulding expands more than the mould. It will be clear that this expansion must be taken into account when determining the mutual positioning of chip (or article) and mould in the hot state.

The invention claimed is:

1. Method for encapsulating a chip with encapsulant, one portion of the surface of which chip must remain free of encapsulant, comprising the following steps
   (a) fixing the chip on a carrier that can be provided with a suitable conductor structure,
   (b) placing the carrier and the chip in one part of a mould having at least two parts,
   (c) positioning a material on a part of one of the mould and the chip surface, such that the material is clamped between the said parts of the chip and the mould after the mould has been closed,
   (d) closing the mould, introducing the encapsulant and creating conditions under which the encapsulant at least partially cures in the mould,
   wherein the material in step (c) consists of a pre-produced moulding made of a suitable heat-resistant material,
   wherein dimensions of the moulding in directions parallel to the surface of the chip are so chosen that a portion of the chip surface, accurately delimited as desired and including the portion of the chip surface that is to be kept free, will be covered when the mould is closed,
   wherein a dimension of the moulding in a direction perpendicular to the chip surface is determined by the desired distance between the mould surface and the portion of the chip surface that is to be kept free,
   wherein the moulding is provided with a top face and a bottom face, essentially parallel to one another, and side walls running between the top and bottom faces, the dimensions of the top face of the moulding being greater than the dimensions of the bottom face, the side walls being at a certain angle with respect to the top face and the bottom face, and
   wherein an inside wall of the mould part against which the moulding is to be fixed is provided with a recess, a shape of the recess corresponding to a shape of a top part of the moulding so that a dimension of the recess at the inside wall of the mould is less than a corresponding dimension of the recess more distant from the inside wall of the mould.

2. Method according to claim 1, characterised in that the material is a relatively soft heat-resistant material.

3. Method according to claim 1, comprising a further step, prior to the step (b), of producing conducting links between contact locations on the chip and contact locations of the conductor structure, the conducting links being effected by wire bonding, the wire bonds taking up a certain amount of space above the chip surface, wherein the dimension of the moulding in the direction perpendicular to the chip surface is determined by a maximum height of the space.

4. Method according to claim 1, characterised in that the moulding is joined in a suitable manner to one part of the mould.

5. Method according to claim 4, characterised in that the moulding is joined to the part of the mould with an adhesive.

6. Method according to claim 4, characterised in that the moulding is mechanically joined to the part of the mould.

7. Method according to claim 1, characterised in that the moulding is moulded directly onto the part of the mould by means of a vulcanisation process.

8. Method according to claim 1, characterised in that after positioning the moulding on the part of the mould, a correction step is carried out in which the shape and position of the moulding are accurately measured and, based on results of the measuring step, the moulding is subsequently subjected to machining if necessary.

9. Method according to claim 1, characterised in that the part of the mould on which the moulding is positioned consists of a part protruding into the interior space of the mould, the cross-section of which part does not have to have a correlation with the cross-section of the moulding.

10. Method according to claim 1, characterised in that after positioning, fixing and, if necessary, subsequent machining of the moulding, a film of a heat-resistant, stretchable material is laid over that part of the mould on which the moulding has been positioned, such that after closing the mould the encapsulant does not come into contact with the wall of that part of the mould but with the film, the film being pressed during the process by the encapsulant onto the wall of said part of the mould.

11. Mould for use in a method according to claim 1 using a moulding characterised in that the moulding is moulded directly onto a part of the mould by means of a vulcanisation process, characterised in that the inside wall of that mould part against which the moulding has to be fixed is provided with a relatively small recess in which a quantity of glue or adhesive can be applied while employing step (c) of the method, it being possible for the said quantity to be matched to the volume of the relatively small recess.

12. Mould for use in a method according to claim 1 using a moulding characterised in that the moulding is moulded directly onto a part of the mould by means of a vulcanisation process, characterised in that the inside wall of that mould part against which the moulding has to be fixed is provided with a recess, the shape of which corresponds to the shape of the top part of the moulding.

13. Mould for use in a method according to claim 1 using a moulding characterised in that the moulding is made up of two sections, a first section provided with a top face, an imaginary bottom face and side walls running between these, the dimensions of the top face being greater than those of the imaginary bottom face and the side walls at least partially being inclined at a certain angle between the top face and the imaginary bottom face, and a second section provided with an imaginary top wall, a bottom wall and side walls running between these, the imaginary top wall and the bottom wall essentially having the same dimensions, and the imaginary bottom face of the first section adjoining the imaginary top wall of the second section, characterised in that the inside wall of the mould part against which the moulding has to be fixed is provided with a blind hole in which the first section fits.

14. Mould according to claim 13, characterised in that the volume of the blind hole is greater than a volume of the first section, at least at room temperature.

15. Mould for use in a method according to claim 1 using a moulding characterised in that the top face is provided with a button, characterised in that the inside wall of the mould part against which the moulding has to be fixed is provided with a hole though which the mould part in which the button fits.

16. Moulding for use in a method according to claim 1, characterised in that the dimensions of the moulding that, after placing in the mould, correspond to the directions parallel to the surface of the chip are so chosen that a portion of the chip surface, accurately delimited as desired and including the said portion of the chip surface that is to be kept free, will be covered when the mould is closed, and
in that the dimension of the moulding that, after placing in the mould, corresponds to the direction perpendicular to the chip surface is determined by the desired distance between the mould surface and the said portion of the chip surface that is to be kept free,
wherein the moulding is provided with a top face and a bottom face, essentially parallel to one another, and side walls running between the top and bottom faces, the dimensions of the top face of the moulding being greater than the dimensions of the bottom face, the side walls being at a certain angle with respect to the top face and the bottom face, and
wherein a top part of the moulding corresponds to a shape of a recess provided in an inside wall of the mould so that a dimension of the recess at the inside wall of the mould is less than a corresponding dimension of the recess more distant from the inside wall of the mould.

17. Moulding according to claim 16, characterised in that at least an edge of the bottom face is shaped in accordance with the outline of the portion of the surface of chip that is to be masked.

18. Moulding according to claim 16, characterised in that the moulding as a whole has a shape of an inverted truncated pyramid.

19. Moulding according to claim 18, characterised in that the dimensions of the said imaginary top and bottom walls are identical to one another.

20. Moulding according to claim 16, characterised in that the moulding as a whole has a shape of an inverted truncated cone.

21. Moulding according to claim 16, characterised in that the bottom face is provided with a relief that projects outwards over a short distance and determines the outline of the portion of the surface of chip to be masked.

22. Moulding according to claim 16, characterised in that the moulding is made up of two sections, a first section provided with a top face, an imaginary bottom face and side walls running between the top face and the bottom face, the dimensions of the top face being greater than those of the imaginary bottom face and the side walls at least partially being inclined at a certain angle between the top face and the imaginary bottom face, and a second section provided with an imaginary top wall, a bottom wall and side walls running between these, the imaginary top wall and the bottom wall essentially having the same dimensions, and the imaginary bottom face of the first section adjoining the imaginary top wall of the second section.

23. Moulding according to claim 22, characterised in that the bottom wall is provided with a relief that projects outwards over a short distance and determines an outline of the portion of the surface of chip to be masked.

24. Moulding according to claim 16, characterised in that the bottom face is provided with a recess that is shaped in such a way that, when carrying out the method, the moulding does not come into contact with a predetermined portion of the chip surface located within the portion of the surface of chip that is to be masked.

25. Moulding according to claim 16, characterised in that the moulding is provided with a protruding part on the top face.

26. Moulding according to claim 25, characterised in that an end of the protruding part is provided with a button.

27. Moulding according to claim 25, characterised in that an end of the protruding part is provided with a threaded hole.

28. Moulding according to claim 25, characterised in that the protruding part has the shape of a truncated pyramid or truncated cone.

29. Moulding according to claim 16 used in combination with a mould characterised in that the inside wall of that mould part against which the moulding has to be fixed is provided with a relatively small recess in which a quantity of glue or adhesive can be applied while employing step (c) of the method, it being possible for the said quantity to be matched to the volume of the relatively small recess, characterised in that the material of the moulding has a greater coefficient of expansion than the material of the mould.

30. A method for encapsulating a chip with encapsulant such that a free portion of a surface of the chip remains free of encapsulant, the method comprising steps of:
   (a) fixing the chip on a carrier that can be provided with a suitable conductor structure;
   (b) placing the carrier and the chip in one part of a mould having at least two parts, a first of the at least two parts comprising a blind recess on an interior surface of the first mould part;
   (c) attaching a moulding to the first mould part by inserting an attachment portion of the moulding into the blind recess, and closing the mould such that the moulding is clamped between the mould and the free portion of the chip; and
   (d) introducing the encapsulant into the mould and creating conditions under which the encapsulant at least partially cures in the mould;

wherein the attachment portion of the moulding has a shape corresponding to an interior of the blind recess; and
   wherein the blind recess is an undercut recess, such that inserting the attachment portion of the moulding requires that the attachment portion of the moulding be deformed.

31. The method of claim 30, wherein dimensions of the blind recess increase gradually as a distance from the surface of the mould increases.

32. The method of claim 30, wherein dimensions of the blind recess increase in a stepwise manner as a distance from the surface of the mould increases.

* * * * *